United States Patent
Xu et al.

(10) Patent No.: US 9,461,073 B2
(45) Date of Patent: Oct. 4, 2016

(54) ARRAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Zhiqiang Xu, Beijing (CN); Heecheol Kim, Beijing (CN); Chao Xu, Beijing (CN)

(73) Assignee: Boe Technology Group Co., Ltd., Beijing (CN)

(*) Notice: Subject to any disclaimer, the term of this patent is extended or adjusted under 35 U.S.C. 154(b) by 0 days.

(21) Appl. No.: 14/429,870

(22) PCT Filed: Jun. 5, 2014

(86) PCT No.: PCT/CN2014/000560
§ 371 (c)(1),
(2) Date: Mar. 20, 2015

(87) PCT Pub. No.: WO2015/109432
PCT Pub. Date: Jul. 30, 2015

(65) Prior Publication Data
US 2016/0027798 A1    Jan. 28, 2016

(30) Foreign Application Priority Data
Jan. 23, 2014    (CN) .......................... 2014 1 0032264

(51) Int. Cl.
*H01L 27/12*    (2006.01)
*G02F 1/1368*    (2006.01)
(Continued)

(52) U.S. Cl.
CPC ........... *H01L 27/124* (2013.01); *G02F 1/1368* (2013.01); *G02F 1/133707* (2013.01);
(Continued)

(58) Field of Classification Search
CPC .................. H01L 27/1259; H01L 27/124
See application file for complete search history.

(56) References Cited

U.S. PATENT DOCUMENTS 6,476,900 B1 * 11/2002 Lee ................... G02F 1/134363
349/141
8,823,911 B2 * 9/2014 Nagano ............. G02F 1/134363
349/143
(Continued)

FOREIGN PATENT DOCUMENTS

CN    101206359    6/2008
CN    101939696    1/2011
(Continued)

OTHER PUBLICATIONS

Translation of International Search Report and Written Opinion from PCT/CN14/00560 dated Oct. 27, 2014.
(Continued)

*Primary Examiner* — Sang V Nguyen
(74) *Attorney, Agent, or Firm* — Calfee, Halter & Griswold LLP

(57) ABSTRACT

The embodiments of the invention provide an array substrate, a method for manufacturing the same and a display device, relate to the field of display technology, and can reduce the color cast phenomenon of the display device, and improve the display effect. The array substrate comprises a plurality of pixel units which are arranged in an array, each of the pixel units comprises a plurality of sub-pixel units, the width of each of the sub-pixel units is equal, each of the sub-pixel units corresponds to one first electrode, the first electrode comprises a plurality of strip-shaped structures which are arranged at an equal interval, and intervals of the strip-shaped structures of the first electrodes corresponding to different sub-pixel units in each of the pixel units are not completely equal; any of the sub-pixel units meets $Q \cdot W + (Q-1)D < A$, wherein A is the width of the sub-pixel units, Q is the number of the strip-shaped structures of the first electrodes corresponding to the sub-pixel units, D is the interval of the strip-shaped structures of the first electrodes corresponding to the sub-pixel units, and W is the width of the strip-shaped structures of the first electrodes corresponding to the sub-pixel units.

10 Claims, 4 Drawing Sheets

(51) Int. Cl.
*G02F 1/1337* (2006.01)
*G02F 1/1343* (2006.01)

(52) U.S. Cl.
CPC ......... *G02F1/134363* (2013.01); *H01L 27/12* (2013.01); *H01L 27/1259* (2013.01); *G02F 2001/134372* (2013.01)

(56) References Cited

U.S. PATENT DOCUMENTS

| | | | | |
|---|---|---|---|---|
| 2003/0197819 A1* | 10/2003 | Sunohara | .......... | G02F 1/133707 349/113 |
| 2006/0203169 A1* | 9/2006 | Ozawa | .............. | G02F 1/134363 349/141 |
| 2009/0135346 A1* | 5/2009 | Kajita | ............... | G02F 1/134363 349/96 |
| 2010/0053528 A1* | 3/2010 | Li | .................... | G02F 1/134309 349/124 |
| 2012/0069283 A1* | 3/2012 | Kizu | ................. | G02F 1/133707 349/141 |
| 2013/0154911 A1* | 6/2013 | Chen | ................ | G02F 1/134336 345/87 |
| 2014/0175446 A1* | 6/2014 | Xu | ...................... | H01L 27/1255 257/71 |
| 2015/0295091 A1* | 10/2015 | Cao | ....................... | G02F 1/1368 257/43 |

FOREIGN PATENT DOCUMENTS

| | | |
|---|---|---|
| CN | 102819153 | 12/2012 |
| CN | 202916564 | 5/2013 |
| CN | 103176315 | 6/2013 |
| CN | 202995918 | 6/2013 |
| CN | 103792741 | 5/2014 |
| JP | 2009300627 | 12/2009 |

OTHER PUBLICATIONS

Office action from Chinese Application No. 201410032264.5 dated Nov. 4, 2015.
International Search Report and Written Opinion from PCT/CN14/00560 dated Oct. 27, 2014.
Office action from Chinese Application No. 201410032264.5 dated Feb. 14, 2016.

* cited by examiner

ARRAY SUBSTRATE, MANUFACTURING METHOD THEREOF, AND DISPLAY DEVICE

RELATED APPLICATIONS

The present application claims the benefit of PCT/CN2014/000560 filed Jun. 5, 2014, which claims the benefit of Chinese Patent Application No. 201410032264.5, filed Jan. 23, 2014, the entire disclosure of which is incorporated herein by reference.

FIELD OF THE INVENTION

The invention relates to the field of display technology, and in particular, to an array substrate, a method for manufacturing the same, and a display device.

BACKGROUND OF THE INVENTION

A liquid crystal panel in a Thin Film Transistor-Liquid Crystal Display (TFT-LCD) is mainly composed of an array substrate, a color film substrate and a liquid crystal layer located between the array substrate and the color film substrate, and two polarizers with two polarization directions completely perpendicular to each other are arranged on the array substrate and the color film substrate, respectively. When the TFT-LCD operates, light rays emitted by a backlight irradiate the array substrate, the transmittance of the light rays through the liquid crystal layer and the color substrate is determined according to image data inputted to the TFT-LCD, and the display panel may display different color grade according to different transmittance and thereby display an image.

On the color film substrate there are regularly arranged color resins of three colors red, green, and blue (RGB), which correspond to sub-pixel units of three colors RGB, respectively, and three sub-pixel units of different colors constitute a pixel. The backlight when the TFT-LCD operates is of white light, which is usually formed by mixing the three primary colors RGB, the white light becomes linearly polarized white light after passing through the polarizer at the array substrate side, and the polarization direction of the linearly polarized light after passing through the liquid crystal layer is affected by the thickness of the liquid crystal layer and the liquid crystal deflection angle. Generally, the structures of pixel electrodes or the common electrode corresponding to three RGB sub-pixel units are identical and the voltages thereof are equal, such that the liquid crystal deflection angles of the three RGB sub-pixel units are identical. Therefore, after the white light rays pass through the liquid crystal layer of which the thickness of the liquid crystals is equal and of which the liquid crystal deflection angles are identical, since the polarization angles of the light of three colors RGB which constitutes the white light rays are different, and then the three kinds of light rays pass through the polarizer at the color film substrate side, such that the transmittance of the three kinds of light is unequal, such a phenomenon will result in inequality of the light intensity ratios of the outgoing light of the three sub-pixel units, in turn result in that there is a color cast between the color manifested by mixing the three kinds of outgoing light and the color of white light, and that there is a difference between a displayed image and an original image due to the effect of the color cast when displaying an image, thereby affecting the display effect.

SUMMARY OF THE INVENTION

Embodiments of the invention provide an array substrate, a method for manufacturing the same, and a display device, and can reduce the color cast phenomenon of the display device and improve the display effect.

To achieve the above objects, embodiments of the invention employ the following technical solutions.

In an aspect, an embodiment of the invention provides an array substrate comprising a plurality of pixel units which are arranged in an array, each of the pixel units comprises a plurality of sub-pixel units, the width of each of the sub-pixel units is equal, each of the sub-pixel units corresponds to one first electrode, each of the first electrodes comprises a plurality of strip-shaped structures which are arranged at an equal interval, wherein intervals of the strip-shaped structures of the first electrodes corresponding to different sub-pixel units in each of the pixel units are not completely equal; any of the sub-pixel units meets $Q \cdot W + (Q-1)D < A$, wherein A is the width of the sub-pixel units, Q is the number of the strip-shaped structures of the first electrodes corresponding to the sub-pixel units, D is the interval of the strip-shaped structures of the first electrodes corresponding to the sub-pixel units, and W is the width of the strip-shaped structures of the first electrodes corresponding to the sub-pixel units.

At the largest transmittance of the voltage-transmittance curves of three RGB sub-pixel units, the curves are relatively smooth. Therein, the voltage values for the largest transmittance of certain two kinds of light (e.g., red light and green light) are relatively close to each other, so the voltage-transmittance curves of the two RG sub-pixel units match more; whereas the voltage at the largest transmittance of the other light (e.g., blue light) is larger than ones at the largest transmittance of the two kinds of RG light. With the increase of the voltage, when the RG light reaches the voltages at the largest transmittance, the transmittance of the blue light is still in a rising state, and therefore does not match the curves for the RG light. By regulating the electrode spacing, such that the voltage at the largest transmittance of the blue light is close to those for the RG light, a better matching effect is obtained.

Optionally, each of the pixel units comprises three sub-pixel units: a red sub-pixel unit, a green sub-pixel unit, and a blue sub-pixel unit; and the number Q of the strip-shaped structures of the first electrode corresponding to each of the sub-pixel units is 3; wherein the interval of the strip-shaped structures of the first electrode corresponding to the red sub-pixel unit is $d_1$; the interval of the strip-shaped structures of the first electrode corresponding to the green sub-pixel unit is $d_2$; the interval of the strip-shaped structures of the first electrode corresponding to the blue sub-pixel unit is $d_3$; $d_1$, $d_2$ and $d_3$ satisfy $d_1 = d_2 < d_3$.

Optionally, $d_1$ is 4 μm, $d_2$ is 4 μm, and $d_3$ is 6 μm.
Optionally, $d_1$ is 4.5 μm, $d_2$ is 4.5 μm, and $d_3$ is 6.5 μm.

In another aspect, an embodiment of the invention provides a display device comprising any of the array substrates described above.

In a further aspect, an embodiment of the invention provides a method for manufacturing an array substrate, the array substrate comprises a plurality of pixel units which are arranged in an array, each of the pixel units comprises a plurality of sub-pixel units, the width of each of the sub-pixel units is equal, each of the sub-pixel units corresponds to one first electrode, each of the first electrodes comprises a plurality of strip-shaped structures which are arranged at an equal interval, and the method comprises: for any one of the sub-pixel units, depositing a first transparent conductive thin film layer on a substrate on which a thin film transistor TFT structure is formed and forming the first electrode through a single patterning process; wherein intervals of the strip-shaped structures of the first electrodes corresponding to different sub-pixel units in each of the pixel units are not completely equal; any of the sub-pixel units meets $Q \cdot W + (Q-1)D<A$, wherein A is the width of the sub-pixel units, Q is the number of the strip-shaped structures of the first electrodes corresponding to the sub-pixel units, D is the interval of the strip-shaped structures of the first electrodes corresponding to the sub-pixel units, and W is the width of the strip-shaped structures of the first electrodes corresponding to the sub-pixel units.

At the largest transmittance of the voltage-transmittance curves of three RGB sub-pixel units, the curves are relatively smooth. Therein, the voltage values for the largest transmittance of certain two kinds of light (e.g., red light and green light) are relatively close to each other, so the voltage-transmittance curves of the two RG sub-pixel units match more; whereas the voltage at the largest transmittance of the other light (e.g., blue light) is larger than ones at the largest transmittance of the two kinds of RG light. With the increase of the voltage, when the RG light reaches the voltages at the largest transmittance, the transmittance of the blue light is still in a rising state, and therefore does not match the curves for the RG light. By regulating the electrode spacing, such that the voltage at the largest transmittance of the blue light is close to those for the RG light, a better matching effect is obtained.

Optionally, the step of depositing a first transparent conductive thin film layer on a substrate on which a thin film transistor TFT structure is formed and forming the first electrode through a single patterning process comprises: depositing a second transparent conductive thin film layer on the substrate on which a thin film transistor TFT is formed and forming a second electrode through a single patterning process; forming a passivation layer on the substrate on which the second electrode is formed; and depositing the first transparent conductive thin film layer on the substrate on which the passivation layer is formed and forming the first electrode through a single patterning process.

Optionally, each of the pixel units comprises three sub-pixel units: a red sub-pixel unit, a green sub-pixel unit, and a blue sub-pixel unit; and the number Q of the strip-shaped structures of the first electrode corresponding to each of the sub-pixel units is 3; wherein the interval of the strip-shaped structures of the first electrode corresponding to the red sub-pixel unit is $d_1$; the interval of the strip-shaped structures of the first electrode corresponding to the green sub-pixel unit is $d_2$; the interval of the strip-shaped structures of the first electrode corresponding to the blue sub-pixel unit is $d_3$; $d_1$, $d_2$ and $d_3$ satisfy $d_1=d_2<d_3$.

Optionally, $d_1$ is 4 μm, $d_2$ is 4 μm, and $d_3$ is 6 μm.

Optionally, $d_1$ is 4.5 μm, $d_2$ is 4.5 μm, and $d_3$ is 6.5 μm.

In the array substrate, the method for manufacturing the same, and the display device, the array substrate comprises a plurality of pixel units which are arranged in an array, each of the pixel units comprises a plurality of sub-pixel units, the width of each of the sub-pixel units is equal, each of the sub-pixel units corresponds to one of the first electrodes, the first electrode comprises a plurality of strip-shaped structures which are arranged at an equal interval, wherein intervals of the strip-shaped structures of the first electrodes corresponding to different sub-pixel units in each of the pixel units are not completely equal; any of the sub-pixel units meets $Q \cdot W + (Q-1)D<A$, wherein A is the width of the sub-pixel units, Q is the number of the strip-shaped structures of the first electrodes corresponding to the sub-pixel units, D is the interval of the strip-shaped structures of the first electrodes corresponding to the sub-pixel units, and W is the width of the strip-shaped structures of the first electrodes corresponding to the sub-pixel units, to solve the problem in which due to equal intervals of the strip-shaped structures of the first electrode corresponding to each of the sub-pixel units comprised in the pixel units comprised in the array substrate, after light rays pass through the pixel units, there is a large difference for the transmittance of the outgoing light of each of the sub-pixel units, thereby leading to the color cast generated by the pixel units.

BRIEF DESCRIPTION OF THE DRAWINGS

In order to more clearly illustrate the technical solutions in embodiments of the invention or in the prior art, the appended drawings needing to be used in the description of the embodiments or the prior art will be introduced briefly in the following. Obviously, the drawings in the following description are only some embodiments of the invention, and for those of ordinary skills in the art, based on the teachings of the invention, other drawings may be obtained according to these drawings under the premise of not paying out creative work.

DETAILED DESCRIPTION OF THE INVENTION

In the following, the technical solutions in embodiments of the invention will be described clearly and completely in connection with the drawings in the embodiments of the invention. Obviously, the described embodiments are only part of the embodiments of the invention, and not all of the embodiments. Based on the embodiments in the invention, all other embodiments obtained by those of ordinary skills in the art under the premise of not paying out creative work pertain to the protection scope of the invention.

Figure 1:
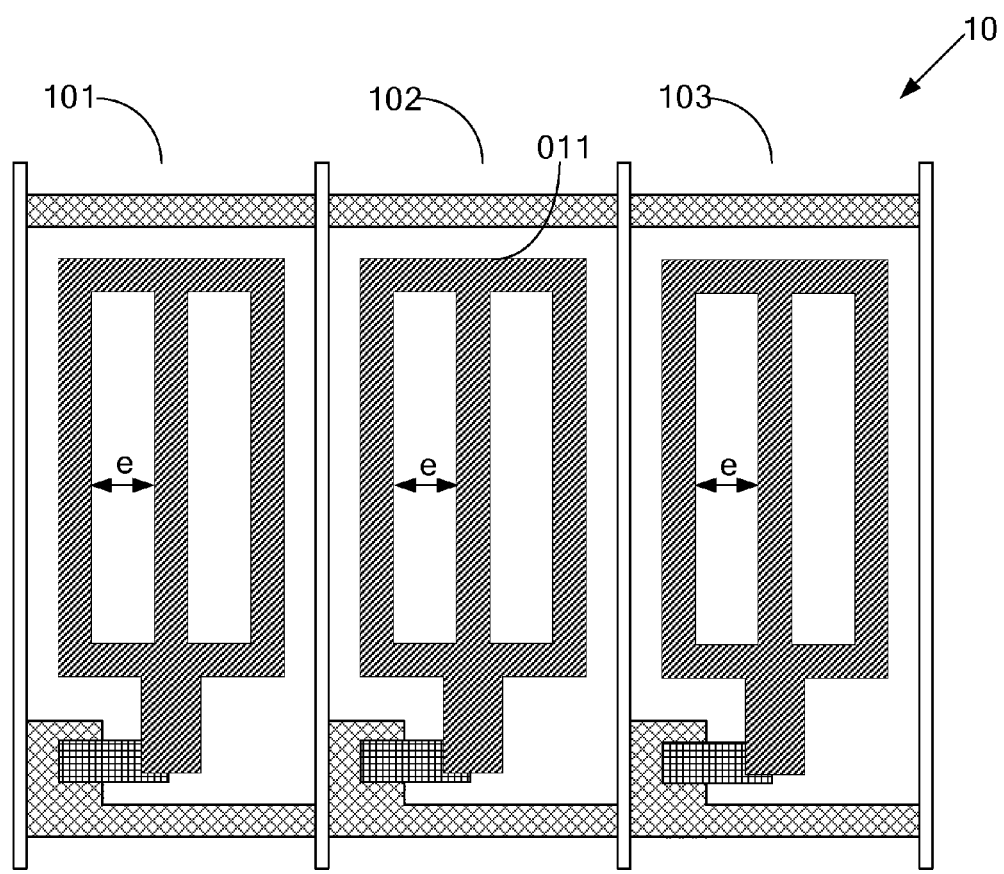
FIG. 1 is a structure diagram of a pixel unit in the prior art.

In the prior art, an array substrate comprises a plurality of pixel units which are arranged in an array, and the structure of the pixel unit is as shown in FIG. 1. The pixel unit 10 shown in FIG. 1 comprises three sub-pixel units: a red sub-pixel unit 101, a green sub-pixel unit 102, and a blue sub-pixel unit 103; wherein each of the sub-pixel units corresponds to a first electrode 011, the first electrode 011 comprises three strip-shaped structures which are arranged at an equal interval, and the two ends of the three strip-shaped structures are connected with each other, such that the voltages across the strip-shaped structures are equal steadily. Therein, the three strip-shaped structures of the first electrode 011 corresponding to the red sub-pixel unit 101 are equally spaced pair-wise, and the interval is e; the three strip-shaped structures of the first electrode 011 corresponding to the green sub-pixel unit 102 are equally spaced pair-wise, and the interval is also e; and the three strip-shaped structures of the first electrode 011 corresponding to the blue sub-pixel unit 103 are equally spaced pair-wise, and the interval is again e. When the voltages across the first electrodes 011 are identical, such that the liquid crystals corresponding to the three sub-pixel units deflect the same angle, at this point, light rays of a backlight pass through a first polarizer and then linearly polarized light is obtained, after the linearly polarized light passes through the red sub-pixel unit 101, the green sub-pixel unit 102 and the blue sub-pixel unit 103 with the same liquid crystal deflection angle and a color film substrate, the resulting outgoing light rays are linearly polarized red light, linearly polarized green light and linearly polarized blue light, respectively, and since the polarization angles of the linearly polarized red light, the linearly polarized green light and the linearly polarized blue light are different, there is a large difference for the transmittance of the red light, the green light and the blue light obtained after passing through a second polarizer, and at this time there is a color case phenomenon in the white light formed by mixing the red light, the green light and the blue light.

An embodiment of the invention provides an array substrate comprising a plurality of pixel units 20 which are arranged in an array, each of the pixel units 20 comprises a plurality of sub-pixel units, the width of each of the sub-pixel units is equal, each of the sub-pixel units corresponds to one first electrode 011, and in a practical application, the first electrode 011 may be a pixel electrode, or may also be a common electrode, which will not be defined by the invention. Each of the first electrodes 011 comprises a plurality of strip-shaped structures which are arranged at an equal interval, and intervals of the strip-shaped structures of the first electrodes 011 corresponding to different sub-pixel units in each of the pixel units 20 are not completely equal, therefore, deflection angles of the liquid crystal molecules corresponding to different sub-pixel units in each of the pixel units 20 are not completely equal, and by regulating the intervals of the strip-shaped structures of the first electrodes 011 corresponding to different sub-pixel units in the pixel unit 20 according to the actual needs, polarization angles of multiple beams of polarized light obtained by passing through different sub-pixel units in the pixel unit 20 may be caused to be identical, thereby causing the white light formed by mixing the multiple beams of polarized light to have no color cast.

Therein, any of the sub-pixel units in the array substrate meets the formula $Q \cdot W + (Q-1)D < A$, wherein A is the width of the sub-pixel units, Q is the number of the strip-shaped structures of the first electrodes corresponding to the sub-pixel units, D is the interval of the strip-shaped structures of the first electrodes corresponding to the sub-pixel units, and W is the width of the strip-shaped structures of the first electrodes corresponding to the sub-pixel units.

At the largest transmittance of the voltage-transmittance curves of three RGB sub-pixel units, the curves are relatively smooth. Therein, the voltage values for the largest transmittance of certain two kinds of light (e.g., red light and green light) are relatively close to each other, so the voltage-transmittance curves of the two RG sub-pixel units match more; whereas the voltage at the largest transmittance of the other light (e.g., blue light) is larger than ones at the largest transmittance of the two kinds of RG light. With the increase of the voltage, when the RG light reaches the voltages at the largest transmittance, the transmittance of the blue light is still in a rising state, and therefore does not match the curves for the RG light. By regulating the electrode spacing, such that the voltage at the largest transmittance of the blue light is close to those for the RG light, a better matching effect is obtained.

As such, since intervals of the strip-shaped structures of the first electrodes corresponding to different sub-pixel units in each of the pixel units are not completely equal, the intervals of the strip-shaped structures of the first electrodes corresponding to different sub-pixel units in the pixel unit may be set according to the actual needs, such that as compared to the prior art, polarization angles of multiple beams of polarized light obtained by passing through different sub-pixel units in the pixel unit are identical, thereby causing the transmittance of the multiple beams of polarized light after passing through the polarizer to be substantially equal, diminishing the color cast problem of the display panel resulting from a large difference for the transmittance of the outgoing light of each of the sub-pixel units, and improving the display effect.

Figure 2:
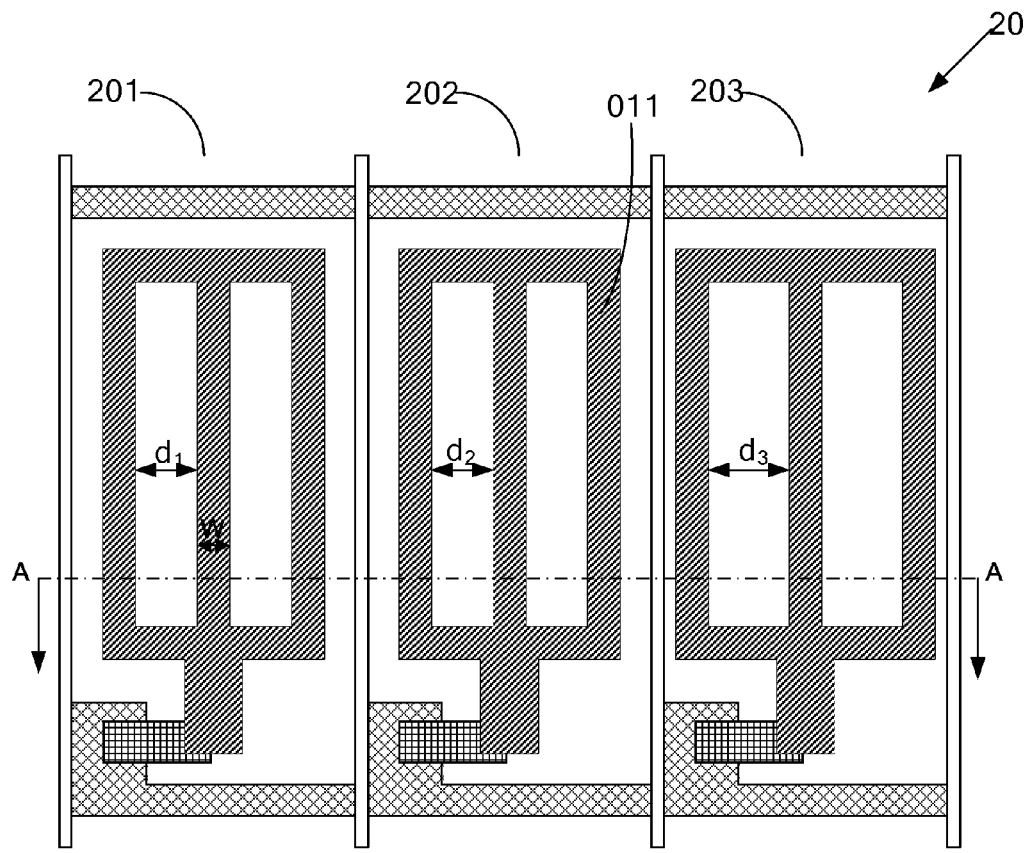
FIG. 2 is a planar structure diagram of a pixel unit provided by an embodiment of the invention.
Figure 3:
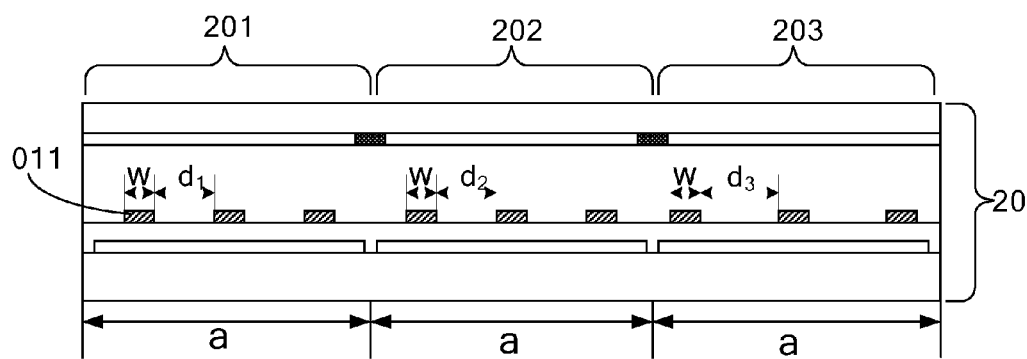
FIG. 3 is a sectional structure diagram of a pixel unit along the line A-A in FIG. 2 provided by an embodiment of the invention.

In particular, as shown in FIGS. 2 and 3, FIG. 2 is a plan view of a pixel unit 20, and FIG. 3 is a sectional view obtained by cutting along the line A-A in FIG. 2. Each of the pixel units 20 of the array substrate comprises three sub-pixel units: a red sub-pixel unit 201, a green sub-pixel unit 202, and a blue sub-pixel unit 203; the width of the three sub-pixel units is a, and the first electrodes 011 corresponding to the three sub-pixel units comprise 3 strip-shaped structures, wherein the interval of the strip-shaped structures of the first electrode 011 corresponding to the red sub-pixel unit 201 is $d_1$; the interval of the strip-shaped structures of the first electrode 011 corresponding to the green sub-pixel unit 202 is $d_2$; the interval of the strip-shaped structures of the first electrode 011 corresponding to the blue sub-pixel unit 203 is $d_3$; and $d_1$, $d_2$ and $d_3$ satisfy $d_1 = d_2 < d_3$. It is known from the prior art that if $d_1 = d_2 = d_3$, then after the linearly polarized white light passes through the red sub-pixel unit 201, the green sub-pixel unit 202 and the blue sub-pixel unit 203 and the color film substrate, the polarization angles of the resulting linearly polarized red light, linearly polarized green light and linearly polarized blue light will be different, such that after passing through the polarizer at the color film substrate side, the transmittance of the linearly polarized blue light will be clearly less than that of the linearly polarized red light or the linearly polarized green light. Therefore, increasing the interval $d_3$ of the strip-shaped structures of the first electrode corresponding to the blue sub-pixel unit 203, or decreasing the intervals $d_1$ and $d_2$ of the strip-shaped structures of the first electrodes corresponding to the red sub-pixel unit 201 and the green sub-pixel unit 202, such that $d_1 = d_2 < d_3$, may result in that the polarization angles of the linearly polarized red light, the linearly polarized green light and the linearly polarized blue light obtained after passing through the red sub-pixel unit 201, the green sub-pixel unit 202 and the blue sub-pixel unit 203 and the color film substrate are substantially identical, thereby causing the transmittance of the red light, the green light and the blue light obtained after passing through the polarizer at the color film substrate side to be substantially consistent, diminishing the color cast problem of the display panel resulting from a large difference for the transmittance of the outgoing light of each of the sub-pixel units, and improving the display effect.

Figure 4:
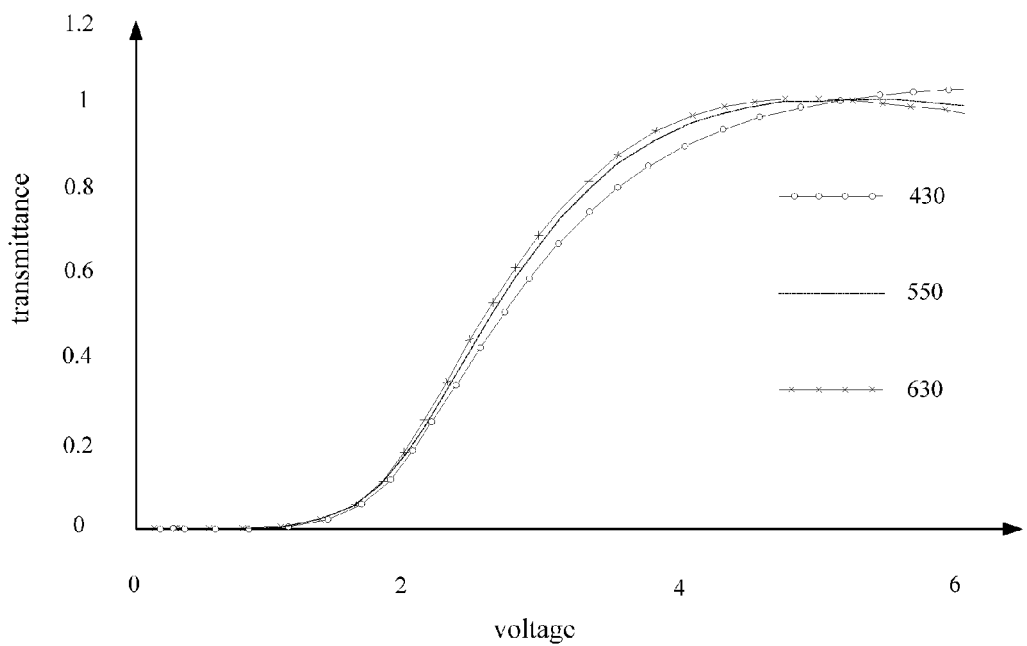
FIG. 4 is a graph of a voltage-transmittance curve of a pixel unit provided by an embodiment of the invention.
Figure 5:
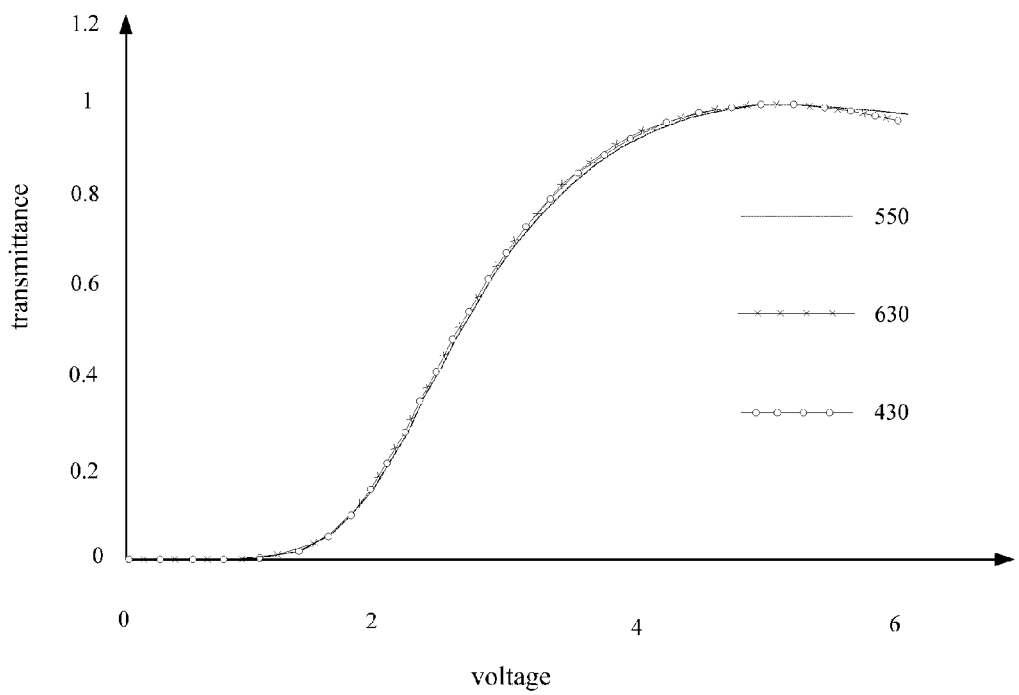
FIG. 5 is a graph of a voltage-transmittance curve of another pixel unit provided by an embodiment of the invention.

Exemplarily, the transmittance of the ultimately outgoing red light, green light and blue light may be caused to be substantially consistent by increasing the interval of the strip-shaped structures of the first electrode 011 corresponding to the blue sub-pixel unit 203. A simulation result is taken as an example for illustration. In simulation, a pixel unit 20 is arranged to comprise a red sub-pixel unit 201, a green sub-pixel unit 202 and a blue sub-pixel unit 203. The outgoing light after the light rays transmit the sub-pixel units, the color film substrate and the polarizer at the color film substrate side is red light with the wavelength of 630 nm, green light with the wavelength of 550 nm and blue light with the wavelength of 430 nm, respectively. When the width of the strip-shaped structures of the first electrodes 011 corresponding to the red sub-pixel unit 201, the green sub-pixel unit 202 and the blue sub-pixel unit 203 is 2 μm, and the intervals thereof are 4 μm, the voltage-transmittance curves of the three sub-pixel units are as shown in FIG. 4. It can be seen from FIG. 4 that when the voltage c applied to the first electrode satisfies $2V \leq c \leq 6V$, there is a large difference for the light transmittance of the three sub-pixel units, in particular, the transmittance of the red light with the wavelength of 630 nm and the green light with the wavelength of 550 nm outgoing from the blue sub-pixel unit 203 is clearly less than that of the blue light with the wavelength of 430 nm outgoing from the red sub-pixel unit 201 and the green sub-pixel unit 202, wherein V is the voltage unit, Volt. When the interval of the strip-shaped structures of the first electrode 011 corresponding to the blue sub-pixel unit 203 of the three sub-pixel units increases, namely, when the width of the strip-shaped structures of the first electrode 011 corresponding to the red sub-pixel unit 201 is 2 μm and the interval $d_1$ is 4 μm, the width of the strip-shaped structures of the first electrode 011 corresponding to the green sub-pixel unit 202 is 2 μm and the interval $d_2$ is 4 μm, and the width of the strip-shaped structures of the first electrode 011 corresponding to the blue sub-pixel unit 203 is 2 μm and the interval $d_3$ is 6 μm, the voltage-transmittance curves of the three sub-pixel units are as shown in FIG. 5. It can be seen from FIG. 5 that when the voltage c applied to the first electrode 011 satisfies $2V \leq c \leq 6V$, the light transmittance of the three sub-pixel units keeps substantially identical, and the color cast resulting from inequality of the light transmittance of the three sub-pixel units is significantly improved.

Figure 6:
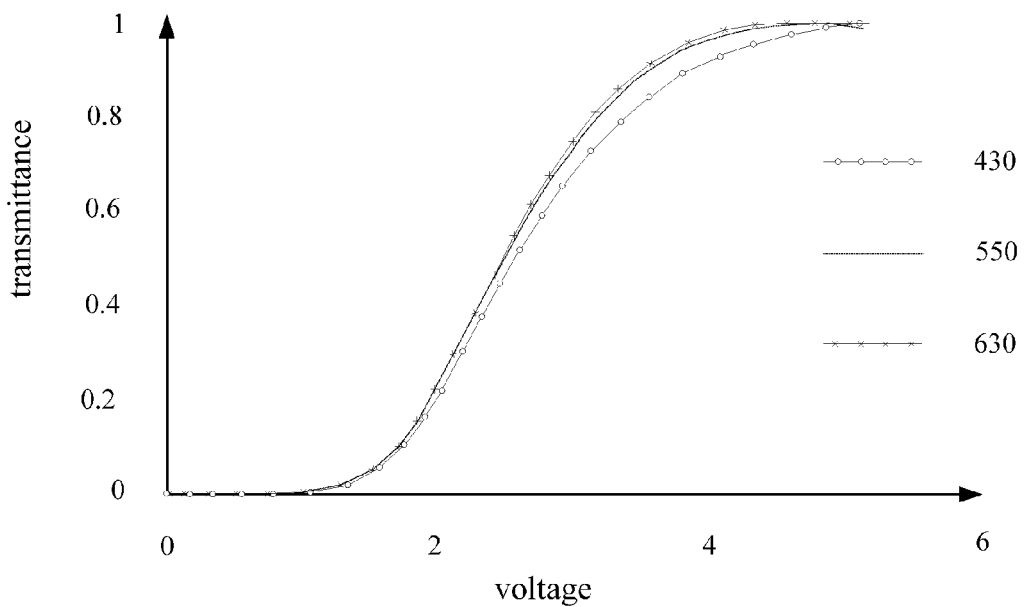
FIG. 6 is a graph of a voltage-transmittance curve of yet another pixel unit provided by an embodiment of the invention.
Figure 7:
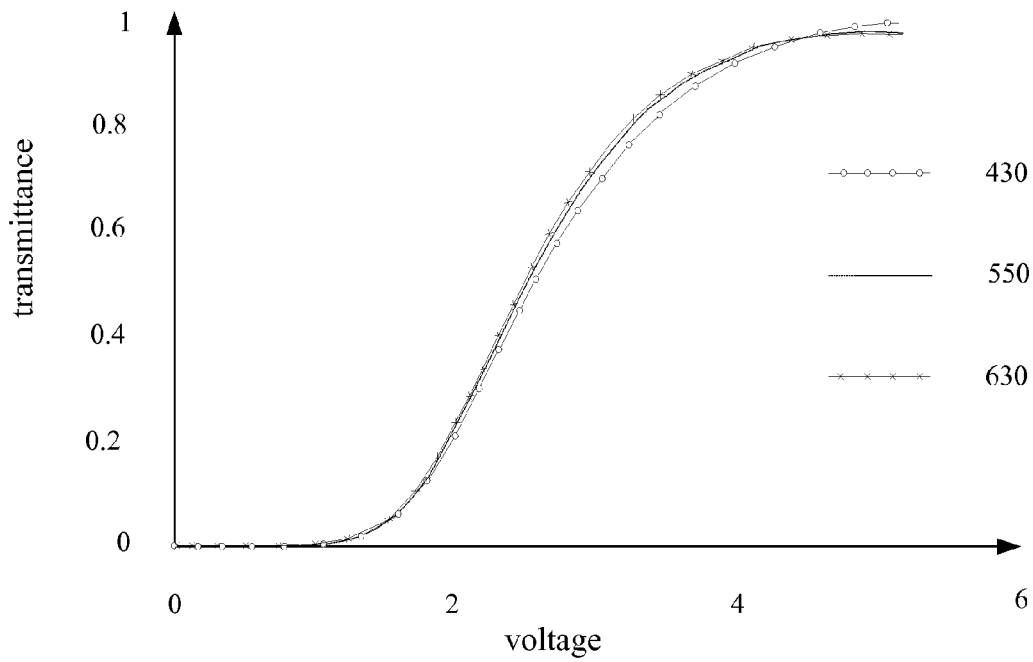
FIG. 7 is a graph of a voltage-transmittance curve of still another pixel unit provided by an embodiment of the invention.

Exemplarily, the transmittance of the ultimately outgoing red light, green light and blue light may be caused to be substantially consistent by decreasing the intervals of the strip-shaped structures of the first electrodes 011 corresponding to the red sub-pixel unit 201 and the green sub-pixel unit 202. A simulation result is taken as an example for illustration. In simulation, the outgoing light after the light rays transmit the sub-pixel units, the color film substrate and the polarizer at the color film substrate side is red light with the wavelength of 630 nm, green light with the wavelength of 550 nm and blue light with the wavelength of 430 nm, respectively. When the width of the strip-shaped structures of the first electrodes 011 corresponding to the red sub-pixel unit 201, the green sub-pixel unit 202 and the blue sub-pixel unit 203 is 2 μm, and the intervals thereof are 6.5 μm, the voltage-transmittance curves of the three sub-pixel units are as shown in FIG. 6. It can be seen from FIG. 6 that when the voltage c applied to the first electrode satisfies $2V \leq c \leq 6V$, there is a large difference for the light transmittance of the three sub-pixel units. When the intervals of the strip-shaped structures of the first electrodes 011 corresponding to the red sub-pixel unit 201 and the green sub-pixel unit 202 of the three sub-pixel units decrease, namely, when the width of the strip-shaped structures of the first electrode 011 corresponding to the red sub-pixel unit 201 is 2 μm and the interval $d_1$ is 4.5 μm, the width of the strip-shaped structures of the first electrode 011 corresponding to the green sub-pixel unit 202 is 2 μm and the interval $d_2$ is 4.5 μm, and the width of the strip-shaped structures of the first electrode 011 corresponding to the blue sub-pixel unit 203 is 2 μm and the interval $d_3$ is 6.5 μm, the voltage-transmittance curves of the three sub-pixel units are as shown in FIG. 7. It can be seen from FIG. 7 that when the voltage c applied to the first electrode 011 satisfies $2V \leq c \leq 6V$, the light transmittance of the three sub-pixel units keeps substantially identical, and the color cast resulting from inequality of the light transmittance of the three sub-pixel units is significantly improved.

In the array substrate provided by embodiments of the invention, intervals of the strip-shaped structures of the first electrodes corresponding to different sub-pixel units in each of the pixel units comprised in the array substrate are not completely equal, such that as compared to the prior art, polarization angles of multiple beams of polarized light obtained by passing through different sub-pixel units in the pixel unit are identical, and that the transmittance of the outgoing light from each of the sub-pixel units after the light rays pass through the pixel units keeps substantially identical, reducing the display chromatic aberration, and improving the display effect.

An embodiment of the invention provides a display device comprising the array substrate described in any of the embodiments of the invention. The array substrate comprises a plurality of pixel units which are arranged in an array, each of the pixel units may comprise a plurality of sub-pixel units, each of the sub-pixel units corresponds to one first electrode, the first electrode comprises a plurality of strip-shaped structures which are arranged at an equal interval, wherein intervals of the strip-shaped structures of the first electrodes corresponding to different sub-pixel units in each of the pixel units are not completely equal; any of the sub-pixel units meets $Q \cdot W + (Q-1)D < A$, wherein A is the width of the sub-pixel units, Q is the number of the strip-shaped structures of the first electrodes corresponding to the sub-pixel units, D is the interval of the strip-shaped structures of the first electrodes corresponding to the sub-pixel units, and W is the width of the strip-shaped structures of the first electrodes corresponding to the sub-pixel units. The array substrate, a color film substrate, and a liquid crystal layer located between the array substrate and the color film substrate constitute the display device, such that the transmittance of the outgoing light from each of the sub-pixel units after the light rays pass through the pixel units keeps substantially identical, reducing the display chromatic aberration, and improving the display effect.

An embodiment of the invention provides a method for manufacturing an array substrate, the array substrate comprises a plurality of pixel units 20 which are arranged in an array, each of the pixel units 20 comprises a plurality of sub-pixel units, each of the sub-pixel units corresponds to one first electrode 011, each of the first electrodes 011 comprises a plurality of strip-shaped structures which are arranged at an equal interval, and the method comprises: for any one of the sub-pixel units, depositing a first transparent conductive thin film layer on a substrate on which a thin film transistor TFT structure is formed and forming the first electrode through a single patterning process; or, first depositing a second transparent conductive thin film layer on a substrate on which a thin film transistor TFT is formed and forming a second electrode through a single patterning process, then forming a passivation layer on the substrate on which the second electrode is formed, depositing the first transparent conductive thin film layer on the substrate on which the passivation layer is formed and forming the first electrode 011 through a single patterning process.

Therein, intervals of the strip-shaped structures of the first electrodes 011 corresponding to different sub-pixel units in each of the pixel units 20 are not completely equal, any of the sub-pixel units meets $Q \cdot W+(Q-1)D<A$, wherein A is the width of the sub-pixel units, Q is the number of the strip-shaped structures of the first electrodes corresponding to the sub-pixel units, D is the interval of the strip-shaped structures of the first electrodes corresponding to the sub-pixel units, and W is the width of the strip-shaped structures of the first electrodes corresponding to the sub-pixel units.

As such, since intervals of the strip-shaped structures of the first electrodes corresponding to different sub-pixel units in each of the pixel units are not completely equal, the intervals of the strip-shaped structures of the first electrodes corresponding to different sub-pixel units in the pixel unit may be set according to the actual needs, such that as compared to the prior art, polarization angles of multiple beams of polarized light obtained by passing through different sub-pixel units in the pixel unit are identical, thereby causing the transmittance of the multiple beams of polarized light after passing through the polarizer to be substantially equal, diminishing the color cast problem of the display panel resulting from a large difference for the transmittance of the outgoing light of each of the sub-pixel units, and improving the display effect.

In particular, each of the pixel units 20 may comprise three sub-pixel units: a red sub-pixel unit 201, a green sub-pixel unit 202, and a blue sub-pixel unit 203; and the first electrode 011 corresponding to each of the sub-pixel units comprises 3 strip-shaped structures, namely, Q=3; wherein the interval of the strip-shaped structures of the first electrode 011 corresponding to the red sub-pixel unit 201 is $d_1$; the interval of the strip-shaped structures of the first electrode 011 corresponding to the green sub-pixel unit 202 is $d_2$; the interval of the strip-shaped structures of the first electrode 011 corresponding to the blue sub-pixel unit 203 is $d_3$; and $d_1$, $d_2$ and $d_3$ satisfy $d_1=d_2<d_3$.

Particularly, when forming the first electrodes 011, the interval of the strip-shaped structures of the first electrode 011 corresponding to the red sub-pixel unit 201 is 4 µm, namely, $d_1$ is 4 µm, the interval of the strip-shaped structures of the first electrode 011 corresponding to the green sub-pixel unit 202 is 4 µm, namely, $d_2$ is 4 µm, and the interval of the strip-shaped structures of the first electrode 011 corresponding to the blue sub-pixel unit 203 is 6 µm, namely, $d_3$ is 6 µm; or, the interval of the strip-shaped structures of the first electrode 011 corresponding to the red sub-pixel unit 201 is 4.5 µm, namely, $d_1$ is 4.5 µm, the interval of the strip-shaped structures of the first electrode 011 corresponding to the green sub-pixel unit 202 is 4.5 µm, namely, $d_2$ is 4 µm, and the interval of the strip-shaped structures of the first electrode 011 corresponding to the blue sub-pixel unit 203 is 6.5 µm, namely, $d_3$ is 6.5 µm.

The method for manufacturing an array substrate provided by the embodiment of the invention comprises, for any one of the sub-pixel units, depositing a first transparent conductive thin film layer on a substrate on which a thin film transistor TFT structure is formed and forming the first electrode through a single patterning process; or, first depositing a second transparent conductive thin film layer on a substrate on which a thin film transistor TFT structure is formed and forming a second electrode through a single patterning process, then forming a passivation layer on the second electrode, depositing the first transparent conductive thin film layer on the passivation layer and forming the first electrode through a single patterning process, such that intervals of the strip-shaped structures of the first electrodes corresponding to different sub-pixel units in each of the pixel units are not completely equal, and that as compared to the prior art, the transmittance of the outgoing light from each of the sub-pixel units after the light rays pass through the pixel units matches more, thereby improving the display effect.

Although in the invention a red sub-pixel unit, a green sub-pixel unit and a blue sub-pixel unit are taken as an example, when a pixel unit used by the display device comprises more or less sub-pixel units, appropriate modifications can be made by those skilled in the art according to the teachings of the invention, such that the transmittance of the outgoing light from each of the sub-pixel units after the light rays pass through the pixel units matches more. Likewise, while a blue sub-pixel unit is taken as an example for illustration, when there is a large deviation between the voltage-transmittance curve of any one of the sub-pixel units and the voltage-transmittance curves of the other (most) sub-pixel units, appropriate modifications can be made by those skilled in the art according to the teachings of the invention, such that the transmittance of the outgoing light from each of the sub-pixel units after the light rays pass through the pixel units matches more.

Described above are just specific embodiments of the invention, however, the protection scope of the invention is not limited thereto, and variations or alternatives easily occurring to any artisan familiar with the technical field within the technical scope disclosed by the invention should be encompassed within the protection scope of the invention. Therefore, the protection scope of the invention should be subject to the protection scope of the claims.

The invention claimed is:

1. An array substrate comprising: a plurality of pixel units arranged in an array, each of the pixel units comprising a plurality of sub-pixel units, the width of each of the sub-pixel units being equal, each of the sub-pixel units corresponding to one first electrode, each of the first electrodes comprising a plurality of strip-shaped structures arranged at an equal electrode gap, wherein
   electrode gaps of the strip-shaped structures of the first electrodes corresponding to different sub-pixel units in each of the pixel units are not completely equal; and
   any of the sub-pixel units meets $Q \cdot W+(Q-1)D<A$, wherein A is the width of the sub-pixel units, Q is the number of the strip-shaped structures of the first electrodes corresponding to the sub-pixel units, D is the electrode gap of the strip-shaped structures of the first electrodes corresponding to the sub-pixel units, and W is the electrode width of the strip-shaped structures of the first electrodes corresponding to the sub-pixel units;
   each of the pixel units comprises three sub-pixel units, wherein the three sub-pixel units comprise a red sub-pixel unit, a green sub-pixel unit, and a blue sub-pixel unit; and the number Q of the strip-shaped structures of the first electrode corresponding to each of the sub-pixel units is 3;
   wherein the electrode gap interval of the strip-shaped structures of the first electrode corresponding to the red sub-pixel unit is $d_1$;
   the electrode gap interval of the strip-shaped structures of the first electrode corresponding to the green sub-pixel unit is $d_2$;
   the electrode gap interval of the strip-shaped structures of the first electrode corresponding to the blue sub-pixel unit is $d_3$; and
   $d_1$, $d_2$ and $d_3$ satisfy $d_1=d_2<d_3$.

2. The array substrate as claimed in claim 1, wherein $d_1$ is 4 µm, $d_2$ is 4 µm, and $d_3$ is 6 µm.

3. The array substrate as claimed in claim 2, wherein $d_1$ is 4.5 µm, $d_2$ is 4.5 µm, and $d_3$ is 6.5 µm.

4. A display device comprising: an array substrate, the array substrate comprising a plurality of pixel units arranged in an array, each of the pixel units comprising a plurality of sub-pixel units, the width of each of the sub-pixel units being equal, each of the sub-pixel units corresponding to one first electrode, each of the first electrodes comprising a plurality of strip-shaped structures arranged at an equal electrode gap, wherein electrode gaps of the strip-shaped structures of the first electrodes corresponding to different sub-pixel units in each of the pixel units are not completely equal; and any of the sub-pixel units meets $Q \cdot W+(Q-1)D<A$, wherein A is the width of the sub-pixel units, Q is the number of the strip-shaped structures of the first electrodes corresponding to the sub-pixel units, D is the electrode gap of the strip-shaped structures of the first electrodes corresponding to the sub-pixel units, and W is the electrode width of the strip-shaped structures of the first electrodes corresponding to the sub-pixel units;

each of the pixel units comprises three sub-pixel units, wherein the three sub-pixel units comprise a red sub-pixel unit, a green sub-pixel unit, and a blue sub-pixel unit and the number Q of the strip-shaped structures of the first electrode corresponding to each of the sub-pixel units is 3;

wherein the electrode gap interval of the strip-shaped structures of the first electrode corresponding to the red sub-pixel unit is $d_1$;

the electrode gap interval of the strip-shaped structures of the first electrode corresponding to the green sub-pixel unit is $d_2$;

the electrode gap interval of the strip-shaped structures of the first electrode corresponding to the blue sub-pixel unit is $d_3$; and $d_1$, $d_2$ and $d_3$ satisfy $d_1=d_2<d_3$.

5. The display device as claimed in claim 4, wherein $d_1$ is 4 μm, $d_2$ is 4 μm, and $d_3$ is 6 μm.

6. The display device as claimed in claim 4, wherein $d_1$ is 4.5 μm, $d_2$ is 4.5 μm, and $d_3$ is 6.5 μm.

7. A method for manufacturing an array substrate, the array substrate comprising a plurality of pixel units arranged in an array, each of the pixel units comprising a plurality of sub-pixel units, the width of each of the sub-pixel units being equal, each of the sub-pixel units corresponding to one first electrode, each of the first electrodes comprising a plurality of strip-shaped structures arranged at an equal electrode gap, wherein the method comprises:

for any one of the sub-pixel units, depositing a first transparent conductive thin film layer on a substrate on which a thin film transistor TFT structure is formed and forming the first electrode through a single patterning process;

wherein electrode gaps of the strip-shaped structures of the first electrodes corresponding to different sub-pixel units in each of the pixel units are not completely equal; and any of the sub-pixel units meets $Q \cdot W+(Q-1)D<A$, wherein A is the width of the sub-pixel units, Q is the number of the strip-shaped structures of the first electrodes corresponding to the sub-pixel units, D is the electrode gap of the strip-shaped structures of the first electrodes corresponding to the sub-pixel units, and W is the electrode width of the strip-shaped structures of the first electrodes corresponding to the sub-pixel units;

each of the pixel units comprises three sub-pixel units, wherein the three sub-pixel units comprise a red sub-pixel unit, a green sub-pixel unit, and a blue sub-pixel unit and the number Q of the strip-shaped structures of the first electrode corresponding to each of the sub-pixel units is 3;

wherein the electrode gap interval of the strip-shaped structures of the first electrode corresponding to the red sub-pixel unit is $d_1$;

the electrode gap interval of the strip-shaped structures of the first electrode corresponding to the green sub-pixel unit is $d_2$;

the electrode gap interval of the strip-shaped structures of the first electrode corresponding to the blue sub-pixel unit is $d_3$; and $d_1$, $d_2$ and $d_3$ satisfy $d_1=d_2<d_3$.

8. The method as claimed in claim 7, wherein the step of depositing a first transparent conductive thin film layer on a substrate having a thin film transistor TFT structure formed thereon and forming the first electrode through a single patterning process comprises:

depositing a second transparent conductive thin film layer on the substrate having a thin film transistor TFT structure formed thereon and forming a second electrode through a single patterning process;

forming a passivation layer on the substrate having the second electrode formed thereon; and depositing the first transparent conductive thin film layer on the substrate having the passivation layer formed thereon and forming the first electrode through a single patterning process.

9. The method as claimed in claim 7, wherein $d_1$ is 4 μm, $d_2$ is 4 μm, and $d_3$ is 6 μm.

10. The method as claimed in claim 7, wherein $d_1$ is 4.5 μm, $d_2$ is 4.5 μm, and $d_3$ is 6.5 μm.

\* \* \* \* \*